(12) United States Patent
Stanton

(10) Patent No.: US 10,300,433 B2
(45) Date of Patent: May 28, 2019

(54) VACUUM PUMPING AND ABATEMENT SYSTEM

(71) Applicant: Edwards Limited, West Sussex (GB)

(72) Inventor: Gareth Stanton, Clevedon (GB)

(73) Assignee: Edwards Limited, Burgess Hill, West Sussex (GB)

( * ) Notice: Subject to any disclaimer, the term of this patent is extended or adjusted under 35 U.S.C. 154(b) by 675 days.

(21) Appl. No.: 14/781,060

(22) PCT Filed: Apr. 1, 2014

(86) PCT No.: PCT/GB2014/051015
§ 371 (c)(1),
(2) Date: Sep. 29, 2015

(87) PCT Pub. No.: WO2014/162120
PCT Pub. Date: Sep. 10, 2014

(65) Prior Publication Data
US 2016/0045860 A1    Feb. 18, 2016

(30) Foreign Application Priority Data

Apr. 4, 2013   (GB) .................................. 1306060.3

(51) Int. Cl.
*F23G 7/06*      (2006.01)
*B01D 53/70*     (2006.01)
(Continued)

(52) U.S. Cl.
CPC ............. *B01D 53/70* (2013.01); *B01D 53/68* (2013.01); *C23C 16/4412* (2013.01); *F23G 7/06* (2013.01);
(Continued)

(58) Field of Classification Search
CPC ........ C23C 16/4412; B01D 53/70; F23G 7/06
(Continued)

(56) References Cited

U.S. PATENT DOCUMENTS 6,090,222 A  *  7/2000  Ivey .......................... B08B 5/00
                                                         134/18
9,631,810 B2 *  4/2017  Czerniak ................ B01D 53/79
(Continued)

FOREIGN PATENT DOCUMENTS

CN     1572016       1/2005
CN     202709138    1/2013
(Continued)

OTHER PUBLICATIONS

Silane MSDS, pp. 1-8.*
(Continued)

*Primary Examiner* — Avinash A Savani
*Assistant Examiner* — Aaron H Heyamoto
(74) *Attorney, Agent, or Firm* — Westman, Champlin & Koehler, P.A.; Theodore M. Magee

(57) ABSTRACT

The present invention relates to a vacuum pumping and abatement system for evacuating processing gas from a process chamber and removing noxious substances from the processing gas. The present invention also relates to a method of purging a vacuum pumping arrangement. The present invention seeks to reduce the cost of ownership and operation and carbon footprint of such systems, by providing a vacuum pumping and abatement system for evacuating processing gas from a process chamber and removing noxious substances from the processing gas, comprising a vacuum pumping arrangement for evacuating processing gas from a process chamber; a source of compressed air for purging the vacuum pumping arrangement during evacuation; and a burner for receiving processing gas and compressed air from the vacuum pumping arrangement and removing noxious substances therefrom by burning the processing gas in oxygen wherein at least some of the
(Continued)

oxygen that supports combustion is derived from the compressed air.

16 Claims, 1 Drawing Sheet

(51) Int. Cl.
 *C23C 16/44* (2006.01)
 *B01D 53/68* (2006.01)
(52) U.S. Cl.
 CPC ............ *B01D 2257/204* (2013.01); *B01D 2257/2025* (2013.01); *B01D 2257/2042* (2013.01); *B01D 2257/2066* (2013.01)
(58) Field of Classification Search
 USPC ........................................ 431/2, 12; 110/252
 See application file for complete search history.

(56) References Cited

U.S. PATENT DOCUMENTS

| | | | | |
|---|---|---|---|---|
| 9,822,974 | B2* | 11/2017 | Kawamura | ............... F23J 13/00 |
| 2002/0014205 | A1 | 5/2002 | Shin et al. | |
| 2004/0195088 | A1* | 10/2004 | Rostaing | ............... B01D 53/323 |
| | | | | 204/164 |
| 2006/0230845 | A1* | 10/2006 | Eiteneer | ............... G01N 1/2247 |
| | | | | 73/863.11 |
| 2008/0017590 | A1* | 1/2008 | Suchak | ............... B01D 53/56 |
| | | | | 210/760 |
| 2008/0069702 | A1* | 3/2008 | Okabe | ............... F15B 13/0821 |
| | | | | 417/65 |
| 2009/0110622 | A1* | 4/2009 | Chiu | ............... B01D 53/346 |
| | | | | 423/241 |
| 2010/0071549 | A1* | 3/2010 | Grant | ............... C23C 16/4412 |
| | | | | 95/12 |
| 2010/0281950 | A1* | 11/2010 | Weres | ............... G01F 15/08 |
| | | | | 73/31.07 |
| 2011/0012040 | A1* | 1/2011 | Bailey | ............... F23N 5/003 |
| | | | | 251/129.03 |
| 2012/0210873 | A1* | 8/2012 | Samura | ............... B01D 53/0462 |
| | | | | 95/148 |
| 2014/0096904 | A1* | 4/2014 | Gim | ............... B32B 37/10 |
| | | | | 156/285 |
| 2014/0302687 | A1* | 10/2014 | Ashihara | ............... C23C 16/4485 |
| | | | | 438/780 |
| 2015/0047564 | A1* | 2/2015 | Kim | ............... C23C 16/45521 |
| | | | | 118/721 |
| 2015/0152966 | A1* | 6/2015 | Sardinskas | ............... F16J 15/182 |
| | | | | 366/98 |

FOREIGN PATENT DOCUMENTS

| | | |
|---|---|---|
| EP | 0802370 A2 | 10/1997 |
| GB | 1308226 | 2/1973 |
| GB | 2308991 A | 7/1997 |
| GB | 2439948 A | 1/2008 |
| JP | H06047269 A | 2/1994 |
| JP | 07286716 A | 10/1995 |
| JP | 2005140028 A | 6/2005 |
| JP | 2007100562 A | 4/2007 |
| JP | 2010517769 A | 5/2010 |
| JP | 2012054541 A | 3/2012 |
| WO | 2007/048995 A1 | 5/2007 |

OTHER PUBLICATIONS

First Office Action and Search Report dated Oct. 17, 2016 in corresponding Chinese Patent Application No. 201480020157.9, 10 pgs.
Combined Search and Examination Report for Application No. GB1306060.3, dated Oct. 18, 2013.
International Search Report for International Application No. PCT/GB2014/051015, dated Jun. 24, 2014.
Notification of Reason for Rejection dated Jan. 25, 2018 for corresponding Japanese Application No. 2016-505886.

* cited by examiner

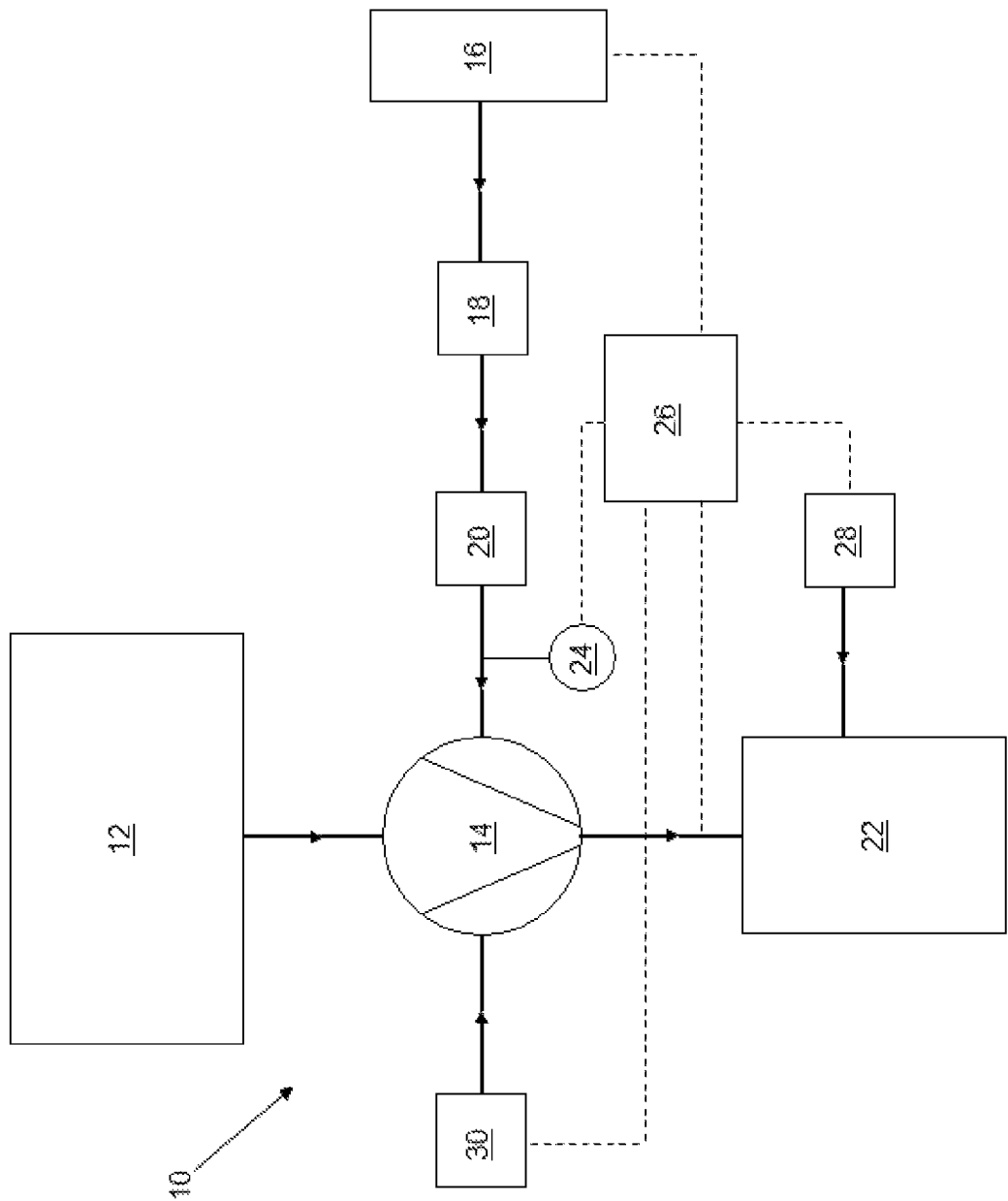

VACUUM PUMPING AND ABATEMENT SYSTEM

This application is a national stage entry under 35 U.S.C. § 371 of International Application No. PCT/GB/2014/051015, filed Apr. 1, 2014, the entire content of which is incorporated herein by reference.

TECHNICAL FIELD

The present invention relates to a vacuum pumping and abatement system for evacuating processing gas from a process chamber and removing noxious substances from the processing gas. The present invention also relates to a method of purging a vacuum pumping arrangement.

BACKGROUND OF THE INVENTION

Vacuum pumping and abatement systems are known hereto for evacuating processing gas from a process chamber and removing noxious substances from the processing gas. Such a system comprises a vacuum pump for evacuating processing gas from a process chamber; and a burner for receiving processing gas from the vacuum pump and removing noxious substances therefrom by burning the processing gas in a fuel and oxygen mixture which is introduced to the burner downstream of the vacuum pump.

Some of processing gases evacuated by the vacuum pump may be corrosive, particularly in the presence of moisture. Corrosion of the pump must be avoided because otherwise it decreases the lifetime of the pump or results in pump failure. In known systems, dry nitrogen is used to purge the pump and dilute the potentially corrosive gases. Nitrogen is used as it does not typically react with the corrosive gases.

This known system suffers from the disadvantage that nitrogen and oxygen must be bought by the operator of the system adding to the cost of ownership and operation. Additionally, pure nitrogen and oxygen must be generated separately using cryogenic distillation requiring energy, therefore contributing to an increased carbon footprint. Thirdly adding oxygen to a fixed flow of nitrogen purge gas results in an elevated total gas flow; as fuel usage in the burner is proportional to total gas flow this results in higher fuel usage.

SUMMARY OF THE INVENTION

The present invention seeks to reduce the cost of ownership and operation and carbon footprint of such systems.

The present invention provides a vacuum pumping and abatement system for evacuating processing gas from a process chamber and removing noxious substances from the processing gas, comprising: a vacuum pumping arrangement for evacuating processing gas from a process chamber; a source of compressed air for purging the vacuum pumping arrangement during evacuation; and a burner for receiving processing gas and compressed air from the vacuum pumping arrangement and removing noxious substances therefrom by burning the processing gas in oxygen wherein at least some of the oxygen that supports combustion is derived from the compressed air.

The present invention also provides a method of purging a vacuum pumping arrangement of a vacuum pumping and abatement system, said system comprising a vacuum pumping arrangement for evacuating processing gas from a process chamber; and a burner for receiving processing gas from the vacuum pumping arrangement and removing noxious substances therefrom by burning the processing gas in oxygen and fuel, said method comprising: conveying into the vacuum pumping arrangement compressed air during evacuation of processing gas from the process chamber for purging the vacuum pumping arrangement and supplying oxygen to the burner for supporting burning.

Other preferred and/or optional aspects of the invention are defined in the accompanying claims.

BRIEF DESCRIPTION OF DRAWINGS

In order that the present invention may be well understood, an embodiment thereof, which is given by way of example only, will now be described with reference to the accompanying drawing, in which:

FIG. 1 shows a schematic diagram of a vacuum pumping and abatement system and a processing chamber.

DETAILED DESCRIPTION OF THE INVENTION

Referring to FIG. 1, a vacuum pumping and abatement system 10 is shown for evacuating processing gas from a process chamber 12 and removing noxious substances from the processing gas. The processing of products is performed in the process chamber 12 in the presence of a processing gas, for example, processing of silicon wafers, such as by dielectric etching or flat panel etching. Typically noxious substances are exhausted from the process chamber during or after processing, including PFCs, O2, HBr, $Cl_2$, $SiF_4$, $SiCl_4$, or $CF_4$. These noxious substances are toxic and/or environmentally harmful and must therefore be scrubbed, or removed, from the exhaust gas stream before their release into the atmosphere.

In known systems, dry nitrogen is used to purge the pump and dilute potentially corrosive gases. However, if the processing gases are oxidants, or otherwise inert in the presence of oxygen, air can be used to purge the pump because the oxygen in the air does not react with the processing gases. There are a number of advantages to the use of air as a purge gas.

First, it is readily abundant and unlike the use of pure nitrogen does not require production for example by prior separation from air. Accordingly, the use of air as a purge gas involves a less energy intensive process and so a reduced carbon footprint.

Further, in known systems, pure oxygen is introduced to the burner downstream of the vacuum pump, because oxygen (and fuel) is required to burn the processing gases. However, gas conveyed from the vacuum arrangement comprises large amounts of nitrogen that has been used to purge the vacuum arrangement. This nitrogen reduces the effectiveness of the combustion of the noxious gases and to compensate additional pure oxygen (and additional fuel) must be injected into the burner. If air is used as a purge gas, then that portion of the air which is oxygen (approximately one fifth) replaces the nitrogen that is normally used to purge the vacuum pump. Accordingly, there is less nitrogen (total gas) in the gas conveyed from the vacuum arrangement to suppress combustion in of noxious gasses in the burner.

Additionally, the gas mixture conveyed from the vacuum pump to the burner already comprises oxygen for supporting combustion. This oxygen content may be sufficient for combustion to occur without addition of further pure oxygen or at least to reduce the amount of pure oxygen which must be injected into the burner.

The system 10 comprises a vacuum pump 14 for evacuating processing gas from the process chamber 12. The vacuum pump shown is a dry vacuum pump which operates without lubrication, or oil, along the flow path through the pump which could otherwise react with the noxious substances in the pump. Although a single vacuum pump is shown in FIG. 1 the vacuum pumping arrangement may comprise a plurality of vacuum pumps, for example a primary and secondary pump or a compression pump and a booster.

A source 16 of compressed air supplies compressed air for purging the vacuum pump 14 during evacuation of processing gas from the process chamber 12. The source of compressed air is adapted to supply compressed air at a pressure greater than atmosphere and preferably at a pressure between 30 kPa and 100 kPa so that it is effective in purging the pump during evacuation.

Means 18, 20 are provided for removing one or both of oil and moisture from the compressed gas prior to introduction to the vacuum pump. In this regard, the compressed air is cleaned by a cleaning unit 18 for removing substances such as oil from the compressed air which may otherwise react with the noxious substances in the processing gas. The cleaning unit 18 may be an oil remover, such as a combustion catalytic bed or an absorber. The compressed air is also dried by a drying unit 20 to remove moisture, which otherwise may also react with the noxious substances. The drying unit 20 may comprise a drying tube producing dry air or may comprise a pair of dryers such that the second dryer of the pair can regenerate while the first is operating. Although not shown, the compressed air may be passed through a rough cleaning unit such as a screen filter to remove excessive oil or water mist.

The source 16 of compressed air may generate compressed air in situ using a suitable compressor (not shown). Alternatively, compressed air can be generated remotely and supplied in a container or by a pipeline. There may a source of compressed air common to multiple processing tools which is then piped to multiple respective vacuum pumping arrangements. The cleaning and drying process may be carried out in situ as shown in FIG. 1 or alternatively it can be carried out remotely and clean dry compressed air supplied in a container or by pipeline. If a compressor is used to compress air in-situ, the lubricant used to lubricate the compressor may pass into the compressed gas flow and this lubricant should be removed as described above. If the compressor compresses ambient air then moisture should also be removed since ambient air contains a small portion of water vapour.

The system 10 is suitable for removing noxious substances from processing gas if the processing gas does not contain noxious substances which would react with the normal constituents of air in the vacuum pump, that is nitrogen, oxygen and carbon dioxide.

A burner 22 is for receiving processing gas and compressed air from the vacuum pump and removing noxious substances by burning the processing gas in a fuel and oxygen mixture. Since compressed air is used in the invention to purge the vacuum pump as opposed to nitrogen in the prior art, and compressed air comprises oxygen at 21% by volume oxygen is already present in the gas stream with the processing gas when the gas stream enters the burner. Accordingly, at least some, and typically all, of the oxygen required for burning is derived from the compressed gas. Therefore, the system 10 has a reduced requirement for oxygen from a separate oxygen source thereby reducing costs and carbon footprint.

Although the burning process may be completed with no additional supply of oxygen, if the burning process requires a greater stoichiometric amount of oxygen by volume for complete reaction to occur additional oxygen may be required, but it should be noted that in any event the amount of oxygen supplied from a separate source is reduced compared to the prior art.

Sensing means 24 is provided for sensing a characteristic of the compressed gas prior to introduction thereof into the pump for purging. The characteristic in this example is one or preferably both of an amount of oil or moisture in the compressed air. In this regard, the sensing means may comprise a moisture sensor or an infrared cell for sensing CH or OH. As shown by broken lines in FIG. 1, the sensing means 24 outputs a "not clean/dry" signal to a control unit 26 if the amount of oil and moisture exceed predetermined limits. The control unit 26 is operably connected to the source 16 of compressed air and is configured to discontinue the supply of compressed air to the pump if a signal is received from the sensing means 24 so that if the compressed air contains moisture or oil reactions caused by reaction with noxious substances can be avoided.

The control unit 26 is also operably connected to an additional source of oxygen 28 and is configured to activate the supply of oxygen from the additional source to the burner 22 when the supply of compressed air to the pump 14 is discontinued or if additional pure oxygen is required for burning over and above the oxygen already present in the gas stream. In this way, when the supply of compressed air is cut-off, oxygen required for burning the processing gas is introduced to the burner 22 from the additional source 28. The oxygen supplied by the source 28 should contain sufficient oxygen by volume to support combustion.

During normal use of the apparatus, compressed gas is conveyed into the vacuum pumping arrangement for purging. However, if for reasons described above or otherwise, the supply of compressed gas is stopped or reduced, the control unit is operably connected to a source 30 of nitrogen to cause nitrogen to be conveyed into the vacuum pumping arrangement for purging.

The processing chamber 12 may be used for multiple different processes or cleaning steps. One process step may be performed in the presence of a noxious gas which is an oxidant or otherwise inert in the presence of oxygen in the compressed air conveyed into the vacuum pumping arrangement. Other processing or clean steps may however be conducted using a gas which is not an oxidant or does react with oxygen in the air. The system 10 has a first condition or state in which compressed air is conveyed into the vacuum pumping arrangement for purging and a second condition or state in which nitrogen is conveyed into the vacuum pumping arrangement for purging in place of compressed air. When nitrogen is used instead of compressed air, pure oxygen is conveyed into the burner from source 28 for supporting combustion. The control unit 26 is operatively connected to the source of oxygen 28 and the source of nitrogen 30 to control operation in the first condition or the second condition dependent on the process or clean steps performed in the process chamber. The control of the system condition may be manual and performed by an operative when the process tool changes from one step to another or alternatively the control 26 may communicate with the control of a process tool and change the system condition dependent on signals received from the control of the process tool.

In a modification of system 10, the air conveyed into the vacuum pumping arrangement may have a portion of its oxygen removed prior to its introduction or the purge mixture conveyed into the pump may comprise both air and pure nitrogen to reduce the stoichiometric amount of oxygen in the purge mixture. This modification may be useful where the process gas contains substances which are weakly reactive with oxygen in the vacuum pumping arrangement. The amount of oxygen removed or its dilution in the purge mixture is selected dependent on the reactivity of the substance with oxygen. The modification still provides a reduction in cost and carbon footprint because the removal of oxygen from air is simpler and consumes less energy than the production of pure oxygen and pure nitrogen.

Additionally, the control unit 26 may be connected to a sensor (not shown) at an inlet of the burner for sensing the amount of oxygen and noxious substances in the gas stream. The control unit 26 controls the sources 28, 30 and supplies additional oxygen or nitrogen to the burner if it is required for burning.

The burner 22 shown in FIG. 1 may be any suitable combustion arrangement for combusting noxious substances in the presence of oxygen and typically also a fuel. Examples of such a burner are shown in the applicant's earlier patent EP 0 802 370, the contents of which are included in their entirety by reference in the present description.

A method of purging a vacuum pump of a vacuum pumping and abatement system will now be described. When processing gas is exhausted from the processing chamber 12 any noxious substances contained in the gas may undesirably attack, corrode or otherwise react with components of the vacuum pump 14. In order to avoid or reduce such reaction, the vacuum pump 14 is purged with compressed air during evacuation of processing gas from the process chamber 12. The compressed air is introduced with the processing gas to the burner 22 and oxygen in the compressed air is used in the burner for burning the processing gas to remove the noxious substances.

A characteristic of the compressed gas is sensed prior to introduction thereof into the pump 14 for purging. The characteristic in this example is the amount of oil or moisture in the compressed air. If the sensed characteristic exceeds a predetermined limit the supply of compressed air to the pump is discontinued to avoid reaction with the noxious substances and in place of the compressed air nitrogen is conveyed into the vacuum pumping arrangement from source 30. The supply of oxygen from the additional source 28 to the burner is activated when the supply of compressed air to the pump is discontinued. In order to reduce possible reaction in the pump, oil and moisture are removed from the compressed gas prior to introduction to the vacuum pump. When the processing gas is burnt noxious substances, including PFCs if present, are removed from the processing gas by the burner and the resultant gas can be released to atmosphere or otherwise disposed of without toxic or environmental risk.

The invention claimed is:

1. A vacuum pumping and abatement system for evacuating processing gas from a process chamber and removing noxious substances from the processing gas, comprising:
   a vacuum pumping arrangement for evacuating processing gas from the process chamber;
   a source of compressed air for purging the vacuum pumping arrangement during evacuation;
   a burner for receiving processing gas and compressed air from the vacuum pumping arrangement and removing noxious substances therefrom by burning the processing gas in oxygen wherein at least some of the oxygen that supports combustion is derived from the compressed air; and
   a source of nitrogen connected for purging the vacuum pumping arrangement, wherein the control unit conveys nitrogen from the source of nitrogen into the vacuum pumping arrangement for purging when the supply of compressed air to the vacuum pumping arrangement is discontinued or reduced.

2. The system as claimed in claim 1, further comprising a sensing means for sensing a characteristic of the compressed gas prior to introduction thereof into a pump for purging.

3. The system as claimed in claim 2, wherein the characteristic is one or both of an amount of oil or moisture in the compressed air and the sensing means outputs a signal to a control unit if the amount of oil or moisture exceeds a predetermined limit.

4. The system as claimed in claim 3, wherein the control unit is operably connected to the source of compressed air and is configured to discontinue the supply of compressed air to the pump if said signal is received from the sensing means.

5. The system as claimed in claim 3, wherein the control unit is operably connected to an additional source of oxygen and is configured to activate the supply of oxygen from the additional source to a burner when the supply of compressed air to the pump is discontinued or reduced.

6. The system as claimed in claim 1, further comprising a means for removing one or both of oil and moisture from the compressed gas prior to introduction to the vacuum pumping arrangement.

7. The system as claimed in claim 1, having a first state for receiving noxious substances from the process chamber that are oxidants or otherwise substantially inert in oxygen in which the vacuum pumping arrangement is purged by compressed air from the source of compressed air, and a second state for receiving noxious substances from the process chamber that are oxidants or otherwise not substantially inert in oxygen in which the vacuum pumping arrangement is purged by nitrogen from the source of nitrogen.

8. The system as claimed in claim 7, having a state for receiving noxious substances from the process chamber that are weakly reactive in oxygen and the compressed air conveyed into the vacuum pumping arrangement has a portion of the oxygen removed prior to introduction or nitrogen from the source of nitrogen is conveyed into the vacuum pumping arrangement with the compressed air forming a purge gas comprising a mixture of air and nitrogen.

9. The system as claimed in claim 1, wherein the source of compressed air is adapted to supply compressed air at a pressure greater than atmosphere.

10. A method of purging a vacuum pumping arrangement of a vacuum pumping and abatement system, the system comprising the vacuum pumping arrangement for evacuating processing gas from a process chamber; and a burner for receiving processing gas from the vacuum pumping arrangement and removing noxious substances therefrom by burning the processing gas in oxygen, said method comprising:
   conveying into the vacuum pumping arrangement a supply of compressed air during evacuation of processing gas from the process chamber for purging the vacuum pumping arrangement and supplying oxygen to the burner for supporting burning;
   wherein a characteristic of the compressed air is sensed prior to introduction thereof into the vacuum pumping arrangement for purging and when the sensed characteristic exceeds a predetermined limit, the supply of compressed air to the vacuum pumping arrangement is discontinued and an additional source of oxygen to the burner is activated.

11. The method as claimed in claim 10, wherein the characteristic is one or both of an amount of oil or moisture in the compressed air.

12. The method as claimed in claim 10, wherein nitrogen is conveyed into the vacuum pumping arrangement when the supply of compressed air into the vacuum pumping arrangement is discontinued or reduced.

13. The method as claimed in claim 10, comprising removing one or both of oil and moisture from the compressed gas prior to introduction to the vacuum pumping arrangement.

14. The method as claimed in claim 10, comprising purging the vacuum pumping arrangement with compressed air when receiving noxious substances from the process chamber that are oxidants or otherwise substantially inert in oxygen and purging the vacuum pumping arrangement with nitrogen when receiving noxious substances from the process chamber that are oxidants or otherwise not substantially inert in oxygen.

15. The method as claimed in claim 10, comprising receiving from the process chamber process gas that is weakly reactive in oxygen and purging the vacuum pumping arrangement with compressed air that has had a portion of the oxygen removed or purging the vacuum pumping arrangement with a purge mixture comprising nitrogen from a source of substantially pure nitrogen and compressed air.

16. The method as claimed in claim 10, wherein compressed air is supplied at a pressure greater than atmosphere.

* * * * *